(12) United States Patent
Hayasaki

(10) Patent No.: US 7,888,777 B2
(45) Date of Patent: Feb. 15, 2011

(54) SEMICONDUCTOR DEVICE AND METHOD FOR MANUFACTURING THE SAME

(75) Inventor: Yuichi Hayasaki, Sakata (JP)

(73) Assignee: Seiko Epson Corporation, Shinjuku-ku, Tokyo (JP)

( * ) Notice: Subject to any disclaimer, the term of this patent is extended or adjusted under 35 U.S.C. 154(b) by 31 days.

(21) Appl. No.: 12/428,991

(22) Filed: Apr. 23, 2009

(65) Prior Publication Data

US 2009/0267193 A1    Oct. 29, 2009

(30) Foreign Application Priority Data

Apr. 23, 2008    (JP)    ............... 2008-112308

(51) Int. Cl.
*H01L 23/544*    (2006.01)
(52) U.S. Cl. ............... 257/620; 257/758; 257/E23.193
(58) Field of Classification Search ............... 257/401, 257/484, 620, 758, E23.193, E23.194, E21.523; 438/113, 458, 462
See application file for complete search history.

(56) References Cited

U.S. PATENT DOCUMENTS 7,586,176 B2 * 9/2009 Wang et al. ............... 257/620

| | | |
|---|---|---|
| 7,629,656 B2 | 12/2009 | Hasegawa et al. |
| 2006/0001165 A1 | 1/2006 | Tokitoh et al. |
| 2006/0145347 A1 | 7/2006 | Aida |

FOREIGN PATENT DOCUMENTS

| | | |
|---|---|---|
| JP | 2006-005011 A | 1/2006 |
| JP | 2006-190839 A | 7/2006 |
| JP | 2007-027639 A | 2/2007 |
| JP | 2007-201182 A | 8/2007 |

* cited by examiner

*Primary Examiner*—Hoai V Pham
(74) *Attorney, Agent, or Firm*—Kilpatrick Townsend & Stockton LLP

(57) ABSTRACT

A semiconductor device includes a semiconductor substrate, a circuit region on the semiconductor substrate, a plurality of metal wires formed in the circuit region on the semiconductor device and a seal ring region surrounding the circuit region. A distance L between an outer periphery of the circuit region and an inner periphery of the seal ring region and a minimum interval $W_{min}$ in mutual intervals of the metal wires have a relationship of "$1 \leq (L/W_{min}) \leq 3$".

8 Claims, 3 Drawing Sheets

SEMICONDUCTOR DEVICE AND METHOD FOR MANUFACTURING THE SAME

The entire disclosure of Japanese Patent Application No. 2008-112308, filed on Apr. 23, 2008, is expressly incorporated by reference herein.

BACKGROUND

1. Technical Field

The present invention relates to a semiconductor device, and a method for manufacturing the same.

2. Related Art

In general, a semiconductor device such as an IC is manufactured in a form of a chip cut out from a silicon wafer having a circuit pattern formed thereon. A plurality of chips are cut out from one wafer. Therefore, technical development for cutting out many chips from one sheet of semiconductor wafer has been taken in order to improve the productivity. In such a technique, there is, for example, a process of miniaturizing the chip by increasing an integration degree of a semiconductor.

On the other hand, as a method for cutting out a semiconductor device from a substrate, a method of dicing is generally used. In the dicing, discrete semiconductor chips are mechanically cut to be separated from each other, and a mechanical stress such as vibration is usually applied to the substrate (wafer). Accordingly, when the chip is miniaturized, a distance between a blade for dicing and the chip is reduced, possibly resulting a crack on the chip during the dicing.

To prevent the above trouble, for example, JP-A-2007-201182 discloses a method in which a guard ring (also called as a seal ring) is provided between a circuit pattern region and a dicing line. The above guard ring can prevent a crack from being formed and improve humidity-resistance of the semiconductor device because the guard ring is formed at the outer periphery of each chip.

However, forming of the guard ring makes the area of the semiconductor device to be increased so that advantage of the miniaturizing of the chip is sacrificed.

SUMMARY

The Inventor of the present invention paid attention to a distance between a circuit region and a seal ring region in a semiconductor device and revealed that a fine semiconductor device having a seal ring region can be provided.

An advantage of the present invention is to provide a highly reliable semiconductor device whereby a crack is hardly formed in its manufacturing process, and to provide a method for manufacturing the same.

A semiconductor device according to a first aspect of the invention includes a semiconductor substrate, a circuit region formed on the semiconductor substrate, a plurality of metal wires formed in the circuit region on the semiconductor substrate and a seal ring region surrounding the circuit region. A distance L between an outer periphery of the circuit region and an inner periphery of the seal ring region and a minimum interval $W_{min}$ in mutual intervals of the metal wires have a relationship of "$1 \leq (L/W_{min}) \leq 3$".

According to the above aspect of the invention, a crack is hardly formed on the semiconductor in its manufacturing process and the semiconductor device has an excellent reliability.

In the semiconductor device according to the invention, the distance L between the outer periphery of the circuit region and the inner periphery of the seal ring region and the minimum interval $W_{min}$ in the mutual intervals of the metal wires may have a relationship of "$1 \leq (L/W_{min}) \leq 2.5$".

In the semiconductor device according to the invention, the distance L between the outer periphery of the circuit region and the inner periphery of the seal ring region and the minimum interval $W_{min}$ in the mutual intervals of the metal wires may have a relationship of "$1 \leq (L/W_{min}) \leq 2$".

In the semiconductor device according to the invention, the distance L between the outer periphery of the circuit region and the inner periphery of the seal ring region and the minimum interval $W_{min}$ in the mutual intervals of the metal wires may have a relationship of "$1.1 \leq (L/W_{min}) \leq 1.9$".

In the semiconductor device according to the invention, the metal wire may be so formed as to include aluminum.

The semiconductor device according to the invention may have a bonding pad.

A method for manufacturing a semiconductor device according to a second aspect of the invention includes steps of preparing a semiconductor substrate, forming a circuit region including a plurality of metal wires on the semiconductor substrate, and forming a seal ring region surrounding the circuit region. A distance L between an outer periphery of the circuit region and an inner periphery of the seal ring region, and a minimum interval $W_{min}$ in mutual intervals of the metal wires have a relationship of "$1 \leq (L/W_{min}) \leq 3$".

According to the above, a crack is hardly formed in the manufacturing process and the semiconductor device having excellent reliability can be obtained.

In the method for manufacturing the semiconductor device according to the invention, the metal wire may be so formed as to include aluminum.

BRIEF DESCRIPTION OF THE DRAWINGS

The invention will be described with reference to the accompanying drawings, wherein like numbers reference like elements.

DESCRIPTION OF EXEMPLARY EMBODIMENTS

The preferred embodiments of the semiconductor device according to the invention will be described with reference to the accompanying drawings. Note that the embodiment described below is an example of the invention.

1. Semiconductor Device

Figure 1:
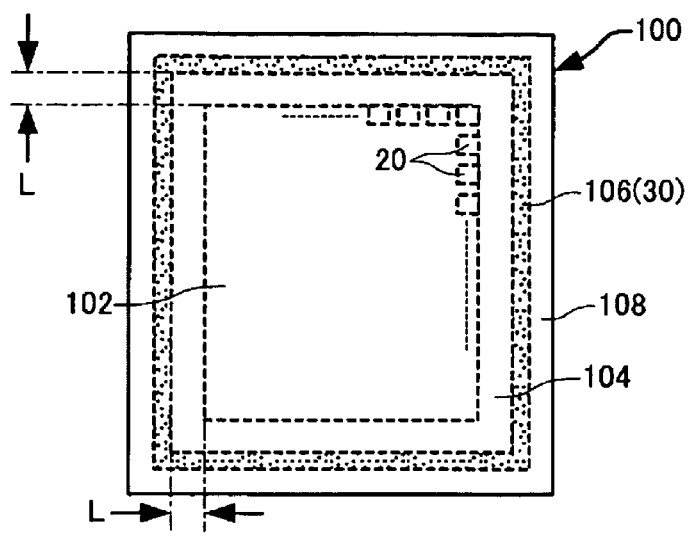
FIG. 1 is a plan view typically showing a semiconductor device 100 according to an embodiment of the invention.
Figure 2:
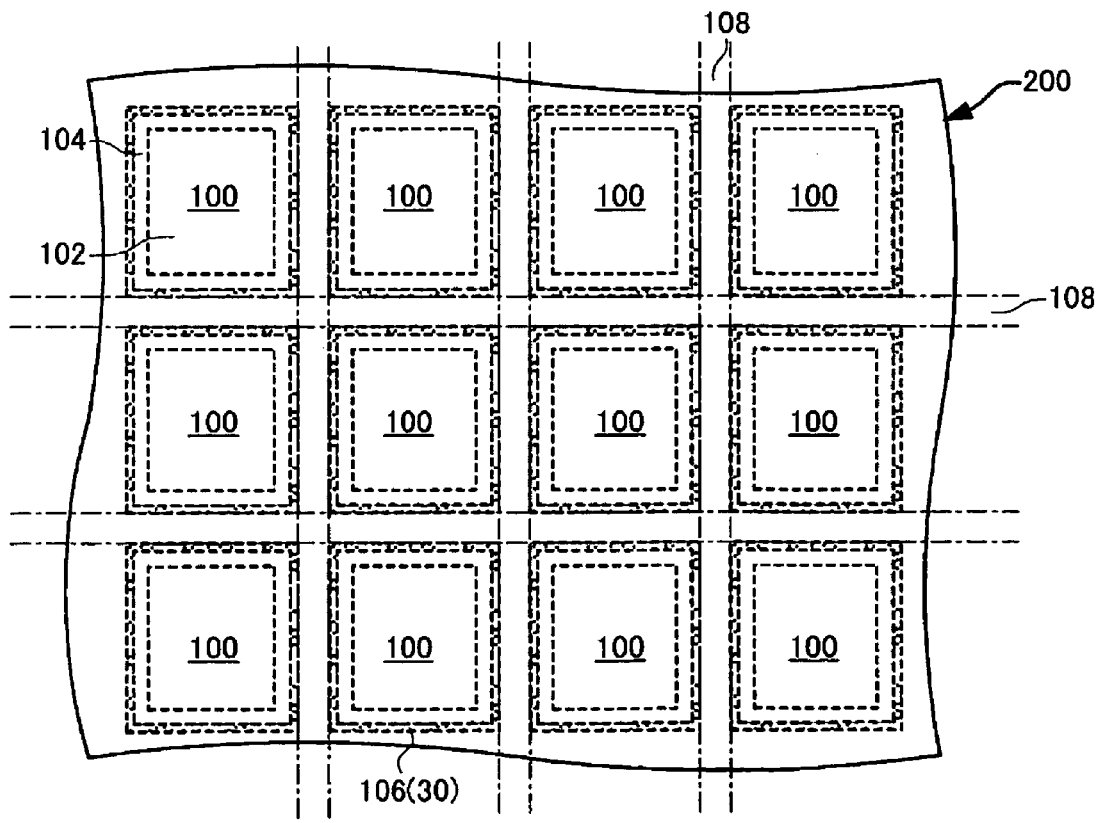
FIG. 2 is a plan view typically showing a wafer 200 according to the embodiment of the invention.
Figure 3:
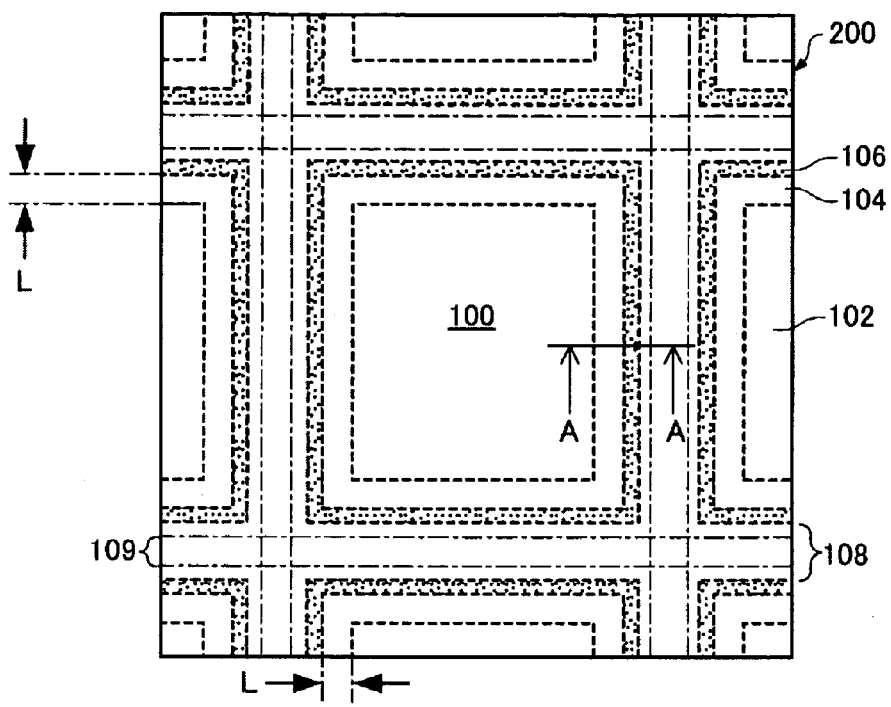
FIG. 3 is a plan view typically showing the wafer 200 according to the embodiment of the invention.
Figure 4:
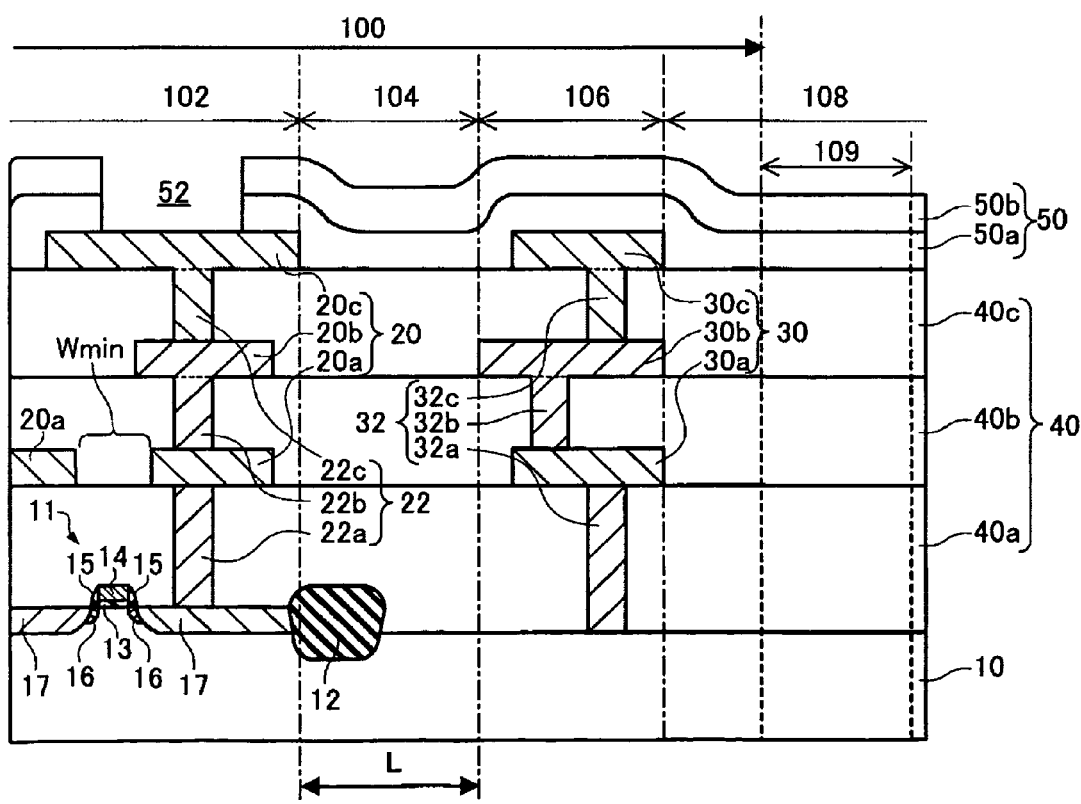
FIG. 4 is a cross-sectional view typically showing the wafer 200 according to the embodiment of the invention.

FIG. 1 is a plan view typically showing a semiconductor device 100 according to a first embodiment of the invention. FIG. 2 is a plan view typically showing a wafer 200 having two or more semiconductor device 100 formed thereon. FIG. 3 is a plan view typically showing the wafer 200 by enlarging a main part of the wafer 200. FIG. 4 is a cross-sectional view typically showing the wafer 200. FIG. 4 is the cross-sectional view taken along the line A-A in FIG. 3.

The semiconductor device 100 according to the embodiment has a circuit region 102, an element placement prohibited region 104, and a seal ring region 106 as shown in FIG. 1 in a plan view. As shown in FIG. 2, the semiconductor device 100 is surrounded by a scribe region 108 on the wafer 200. The wafer 200 is to undergo dicing along the scribe region 108 so that each of the semiconductor devices 100 can be cut out from the wafer 200.

The circuit region 102 can be configured of a plurality of elements so as to have a prescribed function. As shown in FIG. 4, a plurality of metal wires 20 are formed on the circuit region 102. As shown in FIG. 4, a transistor 11 can be placed on the circuit region 102. An electronic element such as a capacitor can be placed on the circuit region 102 (not shown). In addition, it is possible to form a plug 22 for electrically coupling the metal wires 20 on the circuit region 102.

As shown in FIGS. 1 and 4, an outer periphery of the circuit region 102 is a face indicated by a line that connects ends of the plurality of metal wires 20 formed on the circuit region 102 so as to envelope the ends of the metal wires 20 from the outside in a plan view. Even in a case where the semiconductor device 100 is formed in a multi-layer structure and the metal wires 20 are laminated in a plurality of layers, the outer periphery of the circuit region 102 designates the face indicated by a line that connects ends of the plurality of metal wires 20 formed on the circuit region 102 so as to envelope the ends of the metal wires 20 from the outside in a plan view.

In the embodiment shown in FIG. 4, the transistor 11 is formed in the circuit region 102 on a semiconductor substrate 10, and a first interlayer insulation layer 40a, a second interlayer insulation layer 40b and a third interlayer insulation layer 40c are laminated on the semiconductor substrate 10 in the order from lower to upper layers. A first plug 22a, a first metal wire 20a, a second plug 22b, a second metal wire 20b, a third plug 22c and a third metal wire 20c are provided corresponding to each of interlayer insulation layers 40.

As shown in FIG. 4, the outer periphery of the circuit region 102 in the above case designates a face which is vertical along ends of the metal wires having the ends at the outermost side of the circuit region 102 in the metal wires 20a to 20c from a view point of the semiconductor 100 (that is, the end is of each of the metal wires 20c in the embodiment of FIG. 4).

A mutual interval between the plurality of metal wires 20 designates a distance by which the metal wires 20 formed on a specific interlayer insulation layer are mutually separated in a plan view. The mutual interval depends on a kind of a formed element so that it is not always constant. A minimum mutual interval in the mutual intervals of the metal wires 20 in the circuit region 102 is represented by an interval $W_{min}$. The interval $W_{min}$ is a separation distance at a portion where, for example, two metal wires 20 are mostly in close proximity to each other. In the embodiment shown in FIG. 4, another first metal wire 20a in close proximity to the first metal wire 20a is illustrated. In FIG. 4, it is indicated that the minimum interval $W_{min}$ between the metal wires 20 in the circuit region 102 resides in the layer of the first metal wire 20a.

The number of metal wires 20 can be arbitrarily determined. The metal wires 20 have a function of forming a circuit by electrically connecting elements formed in the circuit region 102. The metal wires 20 are formed on the interlayer insulation layer 40. The metal wires 20 are electrically insulated from each other. As a material of the metal wires 20, metals such as copper, aluminum, tungsten, and nickel, and alloys thereof can be listed. It is preferable that the material of the metal wires 20 includes copper or aluminum in view of high conductivity. It is further preferable that the material of the metal wires 20 includes aluminum in view of excellent machining performance.

As shown in FIGS. 1 and 3, the seal ring region 106 is provided so as to surround the circuit region 102 in a plan view. The element placement prohibited region 104 is formed between the circuit region 102 and the seal ring region 106 in a plan view.

In the embodiment shown in FIG. 4, a wiring layer seal ring 30 (30a, 30b, and 30c) and a via-seal ring 32 (32a, 32b, and 32c) are provided in the seal ring region 106. The wiring layer seal ring 30 is formed on the interlayer insulation layer 40 to be in a ring shape along the seal ring region 106. The wiring layer seal ring 30 is electrically insulated from the metal wires 20 formed in the seal ring region 106. The via-seal ring 32 passes through a specific interlayer insulation layer 40 to be in a ring shape along the seal ring region 106. Any via-seal ring 32 is provided at the inside of the wiring layer seal ring 30 in a plan view.

The wiring layer seal ring 30 and via-seal ring 32 can be connected to each other and can form a wall surrounding the circuit region 102. Each of the numbers of wiring layer seal rings 30 and via-seal rings 32 provided in the seal ring region 106 can be arbitrary determined. It is possible to make each of the number of wiring layer seal rings 30 and the number of via-seal rings 32 to be equal to, for example, the number of interlayer insulation layers 40 formed in the semiconductor device 100. It is possible to form each of the wiring layer seal ring 30 and the via-seal ring 32 by a material the same as that of the corresponding metal wire 20 and the plug 32 in the circuit region 102.

An inner periphery of the seal ring region 106 designates a boundary between the seal ring region 106 and the element placement prohibited region 104 in a plan view. In the embodiment shown in FIG. 4, the first via-seal ring 32a, first wiring layer seal ring 30a, second via-seal ring 32b, second wiring layer seal ring 30b, third via-seal ring 32c, and third wiring layer seal ring 30c are provided corresponding to the respective interlayer insulation layers (40a, 40b and 40c). In the embodiment shown in FIG. 4, the second wiring layer seal ring 30b in all the wiring layer seal rings 30 and via-seal rings 32 is so provided to have an end at the innermost side of the semiconductor device 100. In the above case, therefore, a vertical face along the inner ends of the second wiring layer seal rings 30b becomes the inner periphery of the seal ring region 106.

The seal ring region 106 has a function of protecting the semiconductor device 100. For example, the seal ring region 106 has a function of preventing a crack from being formed in the semiconductor device 100 when the semiconductor device 100 is cut out by dicing. In addition, the seal ring region 106 has a wall surrounding the outer side of the circuit region 102 formed by the wiring layer seal rings 30 and via-seal rings 32 and has a function of blocking water diffusing to the circuit region 102 in the lateral direction. The seal ring region 106 also has a function of electrically stabilizing the circuit region 102.

The element placement prohibited region 104 is formed at the inner side of the seal ring region 106 and at the outer side of the circuit region 102 in a plan view. Wires for forming an element or a circuit such as the transistor 11 are not formed in the element placement prohibited region 104. An insulation section such as an element separation film 12 or an insulation material such as an interlayer insulation layer 40 can be placed in the element placement prohibited region 104. In the element placement prohibited region 104, the circuit region 102 and the seal ring region 106 are electrically insulated from each other. The boundary between the element placement prohibited region 104 and the circuit region 102 is consistent with the outer periphery of the above described circuit region 102, and the boundary between the element placement prohibited region 104 and the seal ring region 106 is consistent with the inner periphery of the above described seal ring region 106.

As shown in FIG. 3, the scribe region 108 is provided on the wafer 200 so as to demarcate the semiconductor devices 100. A dicing line 109 is formed along the scribe region 108. The dicing line 109 demarcates a region to be removed by a dicing blade in a dicing process. The dicing line 109 is formed at the inner side of the scribe region 108. The whole region of the scribe region 108 can be the dicing line 109. In addition, it is possible that the dicing line 109 is formed so as to leave a portion of an edge of the scribe region 108 and a part of the left scribe region 108 becomes a part of the semiconductor device 100. In the embodiment shown in FIG. 1, the dicing is carried out so as to leave the scribe region 108 at the outside of the seal ring region 106 in the semiconductor device 100.

As the semiconductor substrate 10, a silicon substrate can be used. Various processes for forming elements of the circuit region 102 can be applied to the semiconductor substrate 10. As shown in FIG. 4, when, for example, the transistor 11 is formed in a region to be the circuit region 102 in the semiconductor substrate 10, an insulation layer such as an ion-doped impurity region 17 and an element separation film 12 can be formed.

The semiconductor device 100 can have a passivation film 50 as shown in FIG. 4. As shown in FIG. 4, the passivation film 50 can be configured such that a silicon oxide film 50a and a silicon nitride film 50b are laminated. The passivation film 50 has a function of, for example, preventing impurity such as water from being diffused from an upper portion of the semiconductor device 100.

In addition, the passivation film 50 can have an opening section 52 as shown in FIG. 4. The opening section 52 is provided above the metal wire 20 formed on an uppermost layer of the circuit region 102. The opening section 52 is provided so as to allow the semiconductor device 100 to be electrically connected to an external device by wire bonding or a bump. The metal wire 20 exposed by the opening section 52 can function as a contact pad. The metal wire shown in FIG. 4 is illustrated as a bonding pad for wire bonding.

As shown in FIG. 1 or FIG. 4, a distance between the outer periphery of the circuit region 102 and the inner region of the seal ring region 106 in a plan view is represented by "L". The semiconductor device 100 of the embodiment has a relationship of "$1 \leq (L/W_{min}) \leq 3$" about the distance L and the above described interval $W_{min}$. It will be clear according to an example described later that even when a value of "$L/W_{min}$" is nearly equal to 1, it is possible to achieve excellent sealing property between the circuit region 102 and the seal ring region 106 by attaining sufficient insulation property between them. When the ratio of "$L/W_{min}$" is greater than 3, the number of semiconductor devices 100 which can be cut out from one wafer 200 is reduced.

Since the semiconductor device 100 of the embodiment has a relationship of "$1 \leq (L/W_{min}) \leq 3$", it is possible to cut out many semiconductor devices 100 from the wafer 200 and the semiconductor device 100 has the seal ring region 106, a crack is hardly formed when the semiconductor devices 100 are cut out from the wafer 200 by dicing. As the semiconductor device 100 has the seal ring region 106, it has excellent humidity resistance and enhanced reliability.

In this embodiment, a relationship of "$1 \leq (L/W_{min}) \leq 2.5$" about the distance L and the above described interval $W_{min}$ is preferable, a relationship of "$1 \leq (L/W_{min}) \leq 2.0$" is more preferable, and a relationship of "$1.1 \leq (L/W_{min}) \leq 1.9$" is particularly preferable. With the above configuration, it is possible to cut out many semiconductors from one wafer 200, and it is possible to achieve excellent sealing property between the circuit region 102 and the seal ring region 106 by attaining sufficient insulation property between them.

2. Method for Manufacturing Semiconductor Device

A method for manufacturing the semiconductor device 100 according to the embodiment is described below. The embodiment described below is an example and the method for manufacturing the semiconductor device 100 having the exemplary structure illustrated in FIG. 4 is described below.

The method for manufacturing the semiconductor device 100 of the embodiment comprises a process of preparing the semiconductor substrate 10, a process of forming the circuit region 102 and a process of forming the seal ring region 106.

In the embodiment, a silicon substrate is used as the semiconductor substrate 10. First, an element separation film 12 is formed on the semiconductor substrate 10, an element region on which a transistor is to be formed is separated from the other regions. Next, the semiconductor substrate 10 is thermally oxidized to form a gate oxidation film 13 on the semiconductor substrate 10. After that, a polysilicon film is formed on a whole face of the semiconductor substrate 10 including the gate oxidation film 13, and then the polysilicon film is subjected to patterning. With the above process, a gate electrode 14 is formed on the gate oxidation film 13. Next, impurity ion is doped to the silicon substrate by using the gate electrode 14 and the element separation film 12 as masks. With the above process, a lightly doped impurity region 16 is formed on the semiconductor substrate 10. After that, a silicon oxide film is formed on the whole face including the gate electrode 14, and then the silicon oxide film is etched back. With the above process, a side of the gate electrode 14 is covered with a side wall 15.

Next, impurity ion is doped to the semiconductor substrate 10 by using as masks the gate electrode 14, side wall 15 and element separation film 12 to form the impurity region 17. After that, a portion residing out of the element separation film 12 in the impurity region 17 is etched.

Next, a first interlayer insulation film 40a is formed on the whole face including the transistor 11. After that, the first interlayer insulation film 40a is etched by using a prescribed pattern. With the above process, a connection hole and a groove are formed on the first interlayer insulation film 40a. At that time, the connection hole is formed on the impurity region 17 of the circuit region 102 and the groove is formed on the semiconductor substrate 10 of the seal ring region 106. Next, tungsten is deposited in each of the connection hole and groove, and on the first interlayer insulation film 40a by a CVD process. At that time, it is possible to form a barrier metal film consisting of TiN and the like under the tungsten.

Next, the tungsten placed on the first interlayer insulation film 40a is removed by polishing by a CMP process. With the above process, a first plug 22a is formed. In addition, the first via-seal ring 32a is formed in the groove. After that, patterning is carried out such that an Al alloy is deposited on the whole face including the first plug 22a, first via-seal ring 32a and first interlayer insulation film 40a by a sputtering process. With the above process, the first metal wire 20a and the first wiring layer seal ring 30a are formed on the first interlayer insulation film 40a. The first metal wire 20a is electrically connected to the impurity region 17 with the first plug 22a therebetween. The first wiring layer seal ring 30a is connected to the top face of the first via-seal ring 32a.

Next, the second interlayer insulation film 40b consisting of silicon oxide is formed on the whole face including the first metal wire 20a, first wiring layer seal ring 30a and first interlayer insulation film 40a by a CVD process. The second interlayer insulation film 40b is etched to form a connection hole and a groove on the second interlayer insulation film 40b similarly to the above described. At that time, the connection hole is formed above the first metal wire 20a. The groove is formed above the first wiring layer seal ring 30a.

Next, patterning is carried out such that an Al alloy is deposited in the connection hole and the groove and on the second interlayer insulation film 40a by a sputtering process. At that time, it is possible to formed a barrier metal film including TiN under the Al metal film. With the above process, the second metal wire 20b is formed on the second interlayer insulation film 40b. As a part of the second metal wire 20b is embedded into the connection hole, the second plug 22b is concurrently formed by the above process. The second metal wire 20b is electrically connected to the first metal wire 20a with the second plug 22b therebetween. In addition, the second via-seal ring 32b and second wiring layer seal ring 30b are formed on the second interlayer insulation film 40 at the same time. The second wiring layer seal ring 30b is connected to a top face of the second via-seal ring 32b.

Next, the third interlayer insulation film 40c is formed on the whole face including the second metal wire 20b, second wiring layer seal ring 30b and second interlayer insulation film 40b. Then, a connection hole is formed on the second metal wire 20b, and a groove is formed at a portion above the second wiring layer seal ring 30b. After that, the third metal wire 20c is formed on the third interlayer insulation film 40c. The third metal wire 20c can function as a pad. As a part of the third metal wire 20c is embedded into the connection hole, the third plug 22c is concurrently formed by the above process. The third metal wire 20c is electrically connected to the second metal wire 20b with the third plug 22c therebetween. In addition, the third via-seal ring 32c and third wiring layer seal ring 30c are at the same time formed on the third interlayer insulation film 40c. The third wiring layer seal ring 30c is coupled to a top face of the third via-seal ring 32c.

Next, a silicon oxide film 50a is formed on the whole face including the third metal wire 20c, third wiring layer seal ring 30c and third interlayer insulation film 40c by a CVD process. Further, a silicon nitride film 50b is formed on the silicon oxide film 50a by a CVD process. Thus, the passivation film 50 consisting of the silicon oxide film 50a and silicon nitride film 50b is formed. Next, the passivation film 50 is subjected to patterning. With the above process, the opening section 52 positioned on the third metal wire 20c is formed.

In the embodiment, thus, the process of forming the circuit region 102 including the plurality of metal wires 20 on the semiconductor substrate 10 and the process of forming the wiring layer seal ring 30 in the seal ring region 106 surrounding the circuit region 102 can be concurrently carried out. In addition, as the above described, the circuit region 102 and the seal ring region 106 are formed so as to allow the distance L and the interval $W_{min}$ to satisfy the relationship of "$1 \leq (L/W_{min}) \leq 3$" described in the phrase of the semiconductor device 100.

Lastly, the dicing is performed along the scribe region 108 and a member in the dicing line 109 is removed to separate the respective semiconductor devices 100 from each other.

3. Examples

Examples of the semiconductor devices according to the invention are described below. While the invention is specifically described, the invention is not limited to the examples described below.

In the table 1, values of $W_{min}$, L, and $(L/W_{min})$ of the examples 1 to 8 are described. The semiconductor devices of the respective examples 1 to 8 are logic ICs having different structures. Design rules and the number of the metal wiring layers of the logic ICs of the respective examples are as follows: example 1: 0.7 μm, 2 layers; example 2: 0.25 μm, 4 layers; example 3: 0.13 μm, 5 layers; example 4: 0.6 μm, 2 layers; example 5: 0.6 μm, 2 layers; example 6: 0.35 μm, 3 layers; example 7: 0.18 μm, 5 layers; and example 8: 0.35 μm, 3 layers.

TABLE 1

| | Example No. | | | | | | | |
|---|---|---|---|---|---|---|---|---|
| | 1 | 2 | 3 | 4 | 5 | 6 | 7 | 8 |
| $W_{min}$ [μm] | 1.8 | 1.0 | 1.2 | 1.2 | 1.2 | 1.4 | 0.8 | 1.1 |
| L [μm] | 2.0 | 1.5 | 2.0 | 2.0 | 2.1 | 2.5 | 1.5 | 2.5 |
| $L/W_{min}$ [—] | 1.1 | 1.5 | 1.7 | 1.7 | 1.8 | 1.8 | 1.9 | 2.3 |
| Initial Characteristic Test (Number of Defectives) | 0 | 0 | 0 | 0 | 0 | 0 | 0 | 0 |

Figure 5:
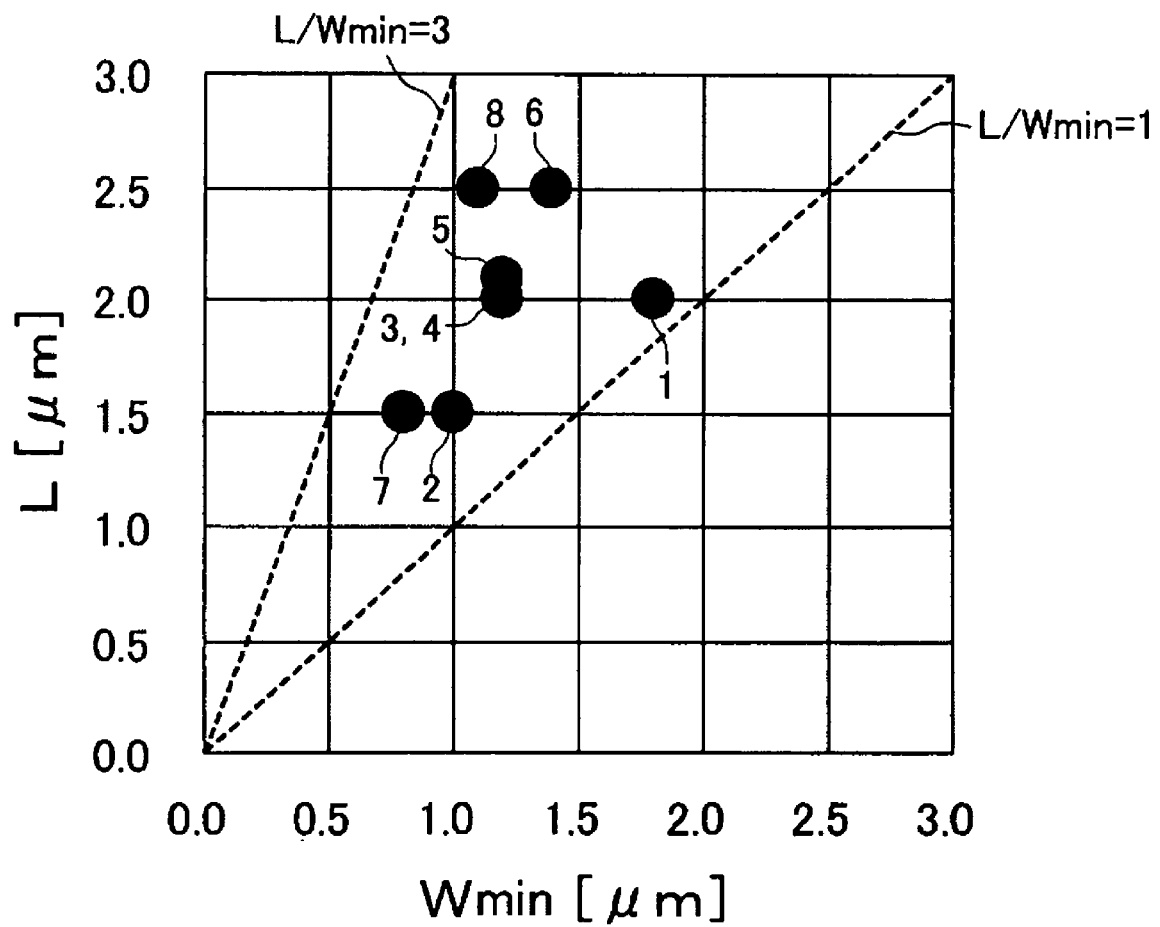
FIG. 5 is a graph plotting conditions of a semiconductor device according to an example of the invention.

FIG. 5 is a graph with the value of L as the ordinate and the value of $W_{min}$ as the abscissa obtained by plotting values of the semiconductors of the respective examples. In the FIG. 5, numerals 1 to 8 corresponds to the respective numbers of the examples. Two dotted lines in the graph of FIG. 5 represent a case of $(L/W_{min})=1$ and a case of $(L/W_{min})=3$, respectively.

Estimation of the semiconductor devices of the examples was performed as described below.

First, an initial characteristic test was applied to a produced logic IC in each example. The initial characteristic test was carried out in a test condition by which a specification of each example as a product of the logic IC was guaranteed. The number of logic ICs which had an operation defect was counted by each example, and then the results are described in the table 1 as the number of defectives in the initial characteristic test.

In the initial characteristic test, there was not any defective of initial characteristic in all the examples. As a result, it was revealed that the logic IC having the relationship of "$1 \leq (L/W_{min}) \leq 3$" sufficiently satisfied the specification about a function and a DC characteristic. In addition, it was confirmed based on the above results that even when the wire bonding was applied to the opening sections 52 of the logic ICs of all the examples, damage did not occur in the seal ring region 106.

Next, a reliability test was applied to the example 1 ($L/W_{min}=1.1$), and example 3 ($L/W_{min}=1.7$) which were typical examples of logic ICs having the relationship of "$1 \leq (L/W_{min}) \leq 3$". The reliability test was carried out in a form of durability confirming test by an acceleration test. As the acceleration test, a high temperature bias test, a high temperature bias operation test, a high temperature, high humidity bias test and a high temperature storage test were carried out. As the conditions of the high temperature bias test, the temperature was 125° C. and the testing time period was maximum 1000 hours. As the conditions of the high temperature bias operation test, the temperature was 125° C. and the testing time period is maximum 1000 hours. As the conditions of the high temperature, high humidity bias test, the temperature was 85° C., the humidity is 85% and the testing time period was maximum 1000 hours. As the conditions of the high temperature storage test, the temperature was 150° C. and the testing time period was maximum 1000 hours.

The logic ICs which were used in the initial characteristic test of the example 1 and the example 3 were used in the respective reliability tests. All the samples which had been subjected to the above acceleration test, were operated in a condition similar to the initial characteristic test. It was judged whether or not each of all the samples maintained its initial performance, and then the number of samples which did not maintain the initial performance, is described in the table 2 as a defective number.

TABLE 2

|  |  | Example 1 | Example 2 |
|---|---|---|---|
|  | $W_{min}$ [μm] | 1.8 | 1.2 |
|  | L [μm] | 2.0 | 2.0 |
|  | $L/W_{min}$ [—] | 1.1 | 1.7 |
| Reliability test (Number of defectives) | High temperature bias test | 0 | 0 |
|  | High temperature bias operation test | 0 | 0 |
|  | High temperature, high humidity bias test | 0 | 0 |
|  | High temperature storage test | 0 | 0 |

As shown in the table 2, the number of defectives of each of the items about example 1 and example 2 was zero according to the reliability test. Consequently, it is revealed that each of logic ICs of the example 1 and example 2 has an excellent reliability when the logic IC is so configured that the distance L between the outer periphery of the circuit region 102 and the inner periphery of the seal ring region 102 and the minimum interval $W_{min}$ in the mutual intervals between the metal wires 20 have the relationship of "$1 \leq (L/W_{min}) \leq 3$". Any logic IC of the example 2, and examples 4 to 8 has the value of $(L/W_{min})$ greater than the value of $(L/W_{min}=1.1)$ of the example 1 so that it is understood that each logic IC has also enhanced reliability. With the above results, it is confirmed that any logic IC of the examples 1 to 8 has excellent initial characteristic and enhanced reliability.

The invention is not limited to the above described embodiment, and various changes and modifications may be made. The invention, for example, includes a structure which is substantially the same as that described in the embodiment (for example, the structure of which the function, method and result are the same as those of the embodiment or the purpose and effect are the same as those of the embodiment). The invention includes a structure in which an unessential part of the structure of the above described embodiment is replaced with another one. The invention includes a structure capable of deriving an action effect or achieving a purpose the same as that of the structure of the described embodiment. The invention includes a structure having the structure of the above described embodiment and a structure of well-known technique added thereto.

What is claimed is:

1. A semiconductor device comprising:
   a semiconductor substrate;
   a circuit region on the semiconductor substrate;
   a plurality of metal wires formed in the circuit region on the semiconductor substrate; and
   a seal ring region surrounding the circuit region, wherein a distance L between an outer periphery of the circuit region and an inner periphery of the seal ring region and a minimum interval $W_{min}$ in mutual intervals of the metal wires have a relationship of "$1 \leq (L/W_{min}) \leq 3$".

2. The semiconductor device according to claim 1, wherein the distance L between the outer periphery of the circuit region and the inner periphery of the seal ring region and the minimum interval $W_{min}$ in the mutual intervals of the metal wires have a relationship of "$1 \leq (L/W_{min}) \leq 2.5$".

3. The semiconductor device according to claim 1, wherein the distance L between the outer periphery of the circuit region and the inner periphery of the seal ring region and the minimum interval $W_{min}$ in the mutual intervals of the metal wires have a relationship of "$1 \leq (L/W_{min}) \leq 2$".

4. The semiconductor device according to claim 1, wherein the distance L between the outer periphery of the circuit region and the inner periphery of the seal ring region and the minimum interval $W_{min}$ in the mutual intervals of the metal wires have a relationship of "$1.1 \leq (L/W_{min}) \leq 1.9$".

5. The semiconductor device according to claim 1, wherein the metal wire is so formed as to include aluminum.

6. The semiconductor device according to claim 1, further comprising:
   a bonding pad.

7. A method for manufacturing a semiconductor device comprising:
   preparing a semiconductor substrate;
   forming a circuit region including a plurality of metal wires on the semiconductor substrate; and
   forming a seal ring region surrounding the circuit region, wherein a distance L between an outer periphery of the circuit region and an inner periphery of the seal ring region and a minimum interval $W_{min}$ in mutual intervals of the metal wires have a relationship of "$1 \leq (L/W_{min}) \leq 3$".

8. The method for manufacturing a semiconductor device according to claim 7, further comprising:
   forming the metal wire by allowing the metal wire to include aluminum.

* * * * *